(12) United States Patent
Park et al.

(10) Patent No.: US 11,550,413 B2
(45) Date of Patent: Jan. 10, 2023

(54) TOUCH SENSOR INTEGRATED COLOR FILTER AND MANUFACTURING METHOD FOR THE SAME

(71) Applicant: DONGWOO FINE-CHEM CO., LTD., Iksan-si (KR)

(72) Inventors: Seong Ho Park, Pyeongtaek-si (KR); Ju In Yoon, Pyeongtaek-si (KR); Kyoung Mo Lee, Pyeongtaek-si (KR); Young Chan Choi, Yongin-si (KR)

(73) Assignee: DONGWOO FINE-CHEM CO., LTD., Iksan (KR)

( * ) Notice: Subject to any disclaimer, the term of this patent is extended or adjusted under 35 U.S.C. 154(b) by 0 days.

(21) Appl. No.: 16/996,505

(22) Filed: Aug. 18, 2020

(65) Prior Publication Data

US 2020/0379596 A1 Dec. 3, 2020

Related U.S. Application Data

(62) Division of application No. 16/096,762, filed as application No. PCT/KR2017/004339 on Apr. 24, 2017, now Pat. No. 10,890,994.

(30) Foreign Application Priority Data

Apr. 29, 2016 (KR) .......................... 10-2016-0053035

(51) Int. Cl.
*G06F 3/041* (2006.01)
*G02F 1/1333* (2006.01)
(Continued)

(52) U.S. Cl.
CPC .......... *G06F 3/0412* (2013.01); *G02F 1/1333* (2013.01); *G02F 1/1335* (2013.01);
(Continued)

(58) Field of Classification Search
CPC ...... G06F 3/0412; G06F 3/044; G06F 3/0443; G06F 3/041; G06F 2203/04112;
(Continued)

(56) References Cited

U.S. PATENT DOCUMENTS

2010/0136868 A1* 6/2010 Chien .................... G06F 3/0412
445/24
2015/0346866 A1* 12/2015 Kusunoki ............. G06F 1/1652
345/174
(Continued)

FOREIGN PATENT DOCUMENTS

| CN | 103792711 A | 5/2014 |
|---|---|---|
| JP | 2012-220670 A | 11/2012 |

(Continued)

OTHER PUBLICATIONS

International Search Report for PCT/KR2017/004339, dated Aug. 7, 2017.

*Primary Examiner* — Mark Edwards
(74) *Attorney, Agent, or Firm* — Sughrue Mion, PLLC

(57) ABSTRACT

A touch sensor integrated color filter and a manufacturing method for the touch sensor integrated filter are disclosed. In the touch sensor integrated color filter, a touch sensor layer including a metal layer and a transparent conductive layer is formed on a black matrix of a flexible color filter.

8 Claims, 6 Drawing Sheets

(51) Int. Cl.
*G02F 1/1335* (2006.01)
*G06F 3/044* (2006.01)
*H01L 27/32* (2006.01)
*H01L 51/52* (2006.01)

(52) U.S. Cl.
CPC .... *G02F 1/13338* (2013.01); *G02F 1/133512* (2013.01); *G02F 1/133516* (2013.01); *G06F 3/044* (2013.01); *G06F 3/0443* (2019.05); *G06F 3/0446* (2019.05); *H01L 27/322* (2013.01); *H01L 27/323* (2013.01); *G02F 1/133305* (2013.01); *G06F 2203/04102* (2013.01); *G06F 2203/04103* (2013.01); *G06F 2203/04111* (2013.01); *G06F 2203/04112* (2013.01); *H01L 51/5284* (2013.01)

(58) Field of Classification Search
CPC . G06F 2203/04111; G06F 2203/04103; G06F 2203/04102; H01L 27/323; H01L 27/322; H01L 51/5284; G02F 1/133516; G02F 1/133512; G02F 1/13338; G02F 1/13305; G02F 1/1335; G02F 1/1333; G02F 1/133514
See application file for complete search history.

(56) References Cited

U.S. PATENT DOCUMENTS

| | | | |
|---|---|---|---|
| 2016/0062537 A1* | 3/2016 | Kim | G06F 3/0416 345/174 |
| 2016/0149164 A1* | 5/2016 | Lee | H01L 27/323 257/40 |
| 2016/0209970 A1* | 7/2016 | Lee | G09F 9/301 |
| 2016/0342236 A1* | 11/2016 | Xu | G06F 3/0412 |
| 2017/0242545 A1* | 8/2017 | Kimura | G06F 3/0445 |
| 2017/0278900 A1* | 9/2017 | Yang | H01L 27/3272 |
| 2018/0136502 A1* | 5/2018 | Mugiraneza | G02F 1/133512 |

FOREIGN PATENT DOCUMENTS

| | | |
|---|---|---|
| JP | 2014-002195 A | 1/2014 |
| JP | 2014-531640 A | 11/2014 |
| JP | 2016-018141 A | 2/2016 |
| KR | 10-2000-0039656 A | 7/2000 |
| KR | 10-2013-0141795 A | 12/2013 |
| KR | 10-2014-0030551 A | 3/2014 |
| KR | 10-2014-0041949 A | 4/2014 |
| KR | 10-2014-0070340 A | 6/2014 |
| KR | 10-2015-0121402 A | 10/2015 |
| KR | 10-2016-0016563 A | 2/2016 |
| WO | 2016/035202 A1 | 3/2016 |

\* cited by examiner

[Figure 1]
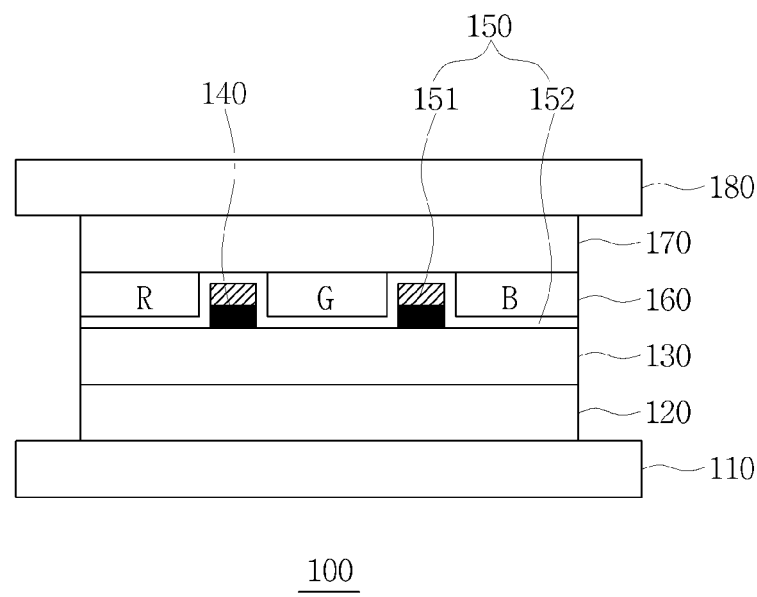
[Figure 2]
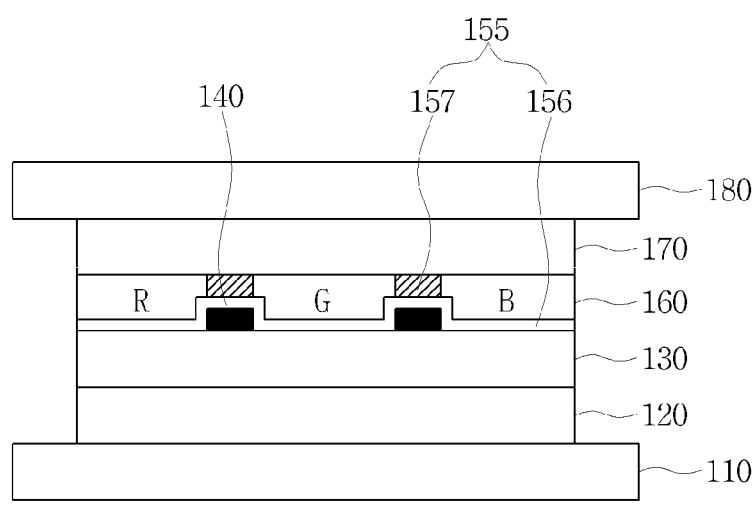

[Figure 3]
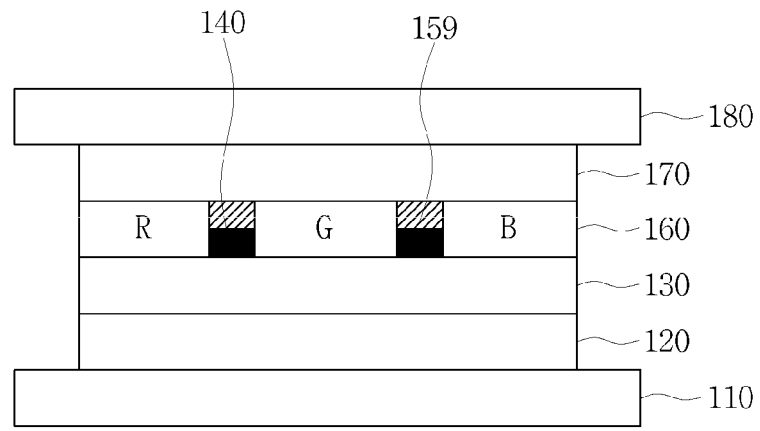
[Figure 4a]
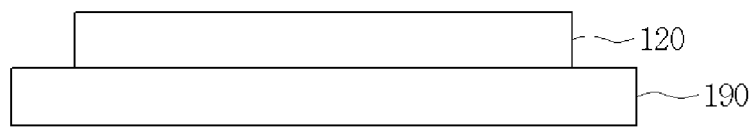
[Figure 4b]
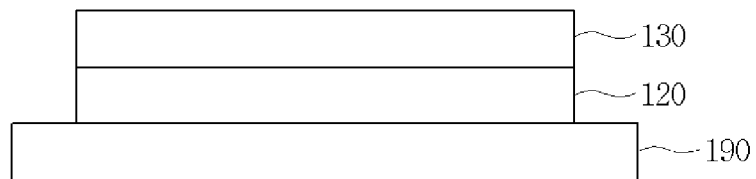
[Figure 4c]
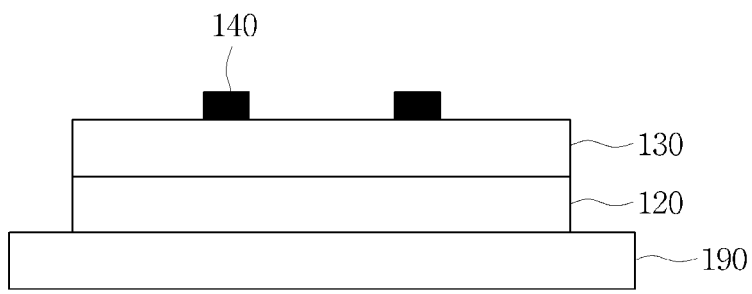

[Figure 4d]
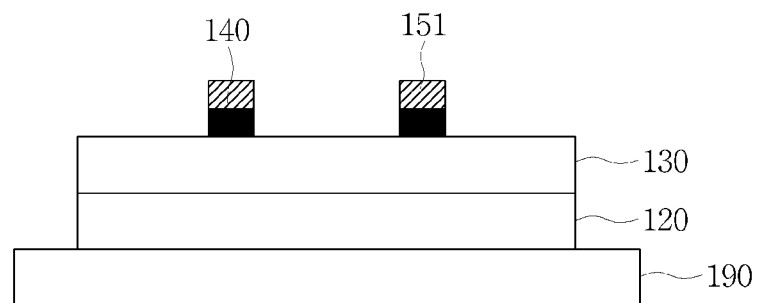
[Figure 4e]
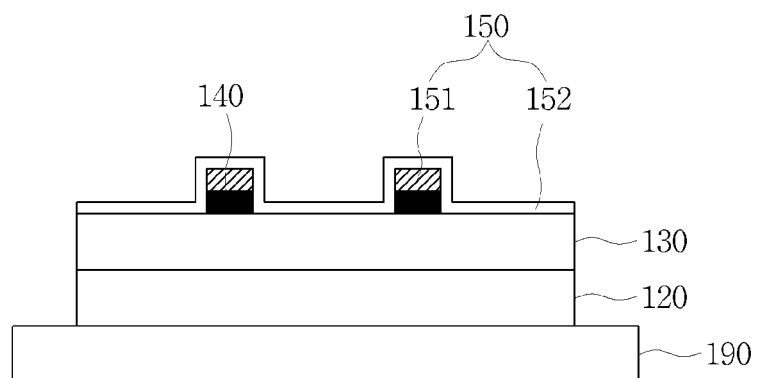
[Figure 4f]
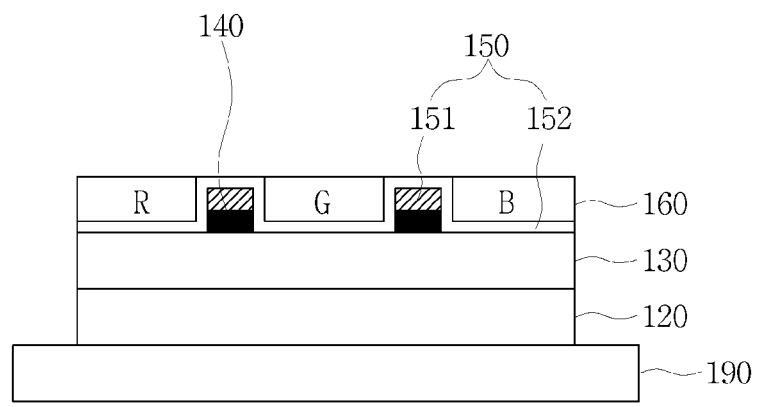

[Figure 4g]
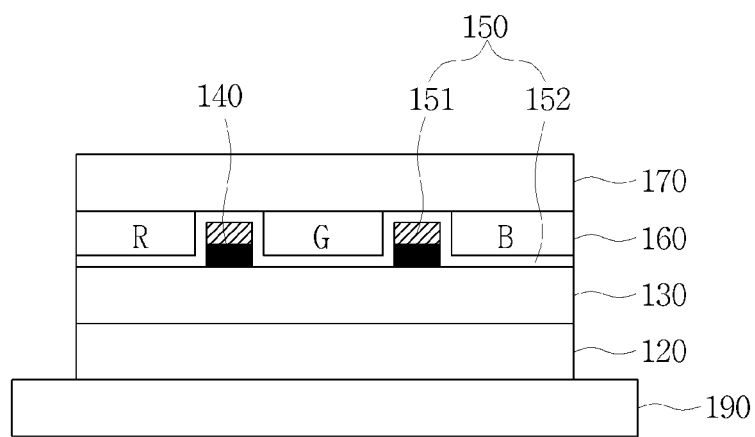
[Figure 4h]
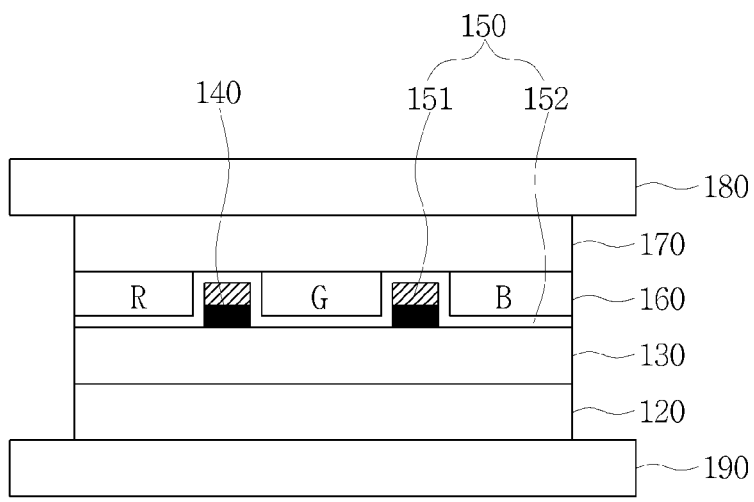

[Figure 4i]
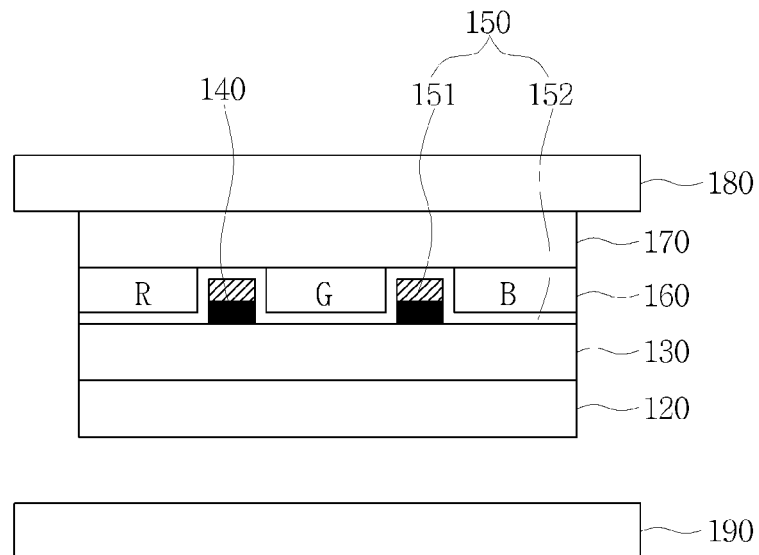
[Figure 4j]
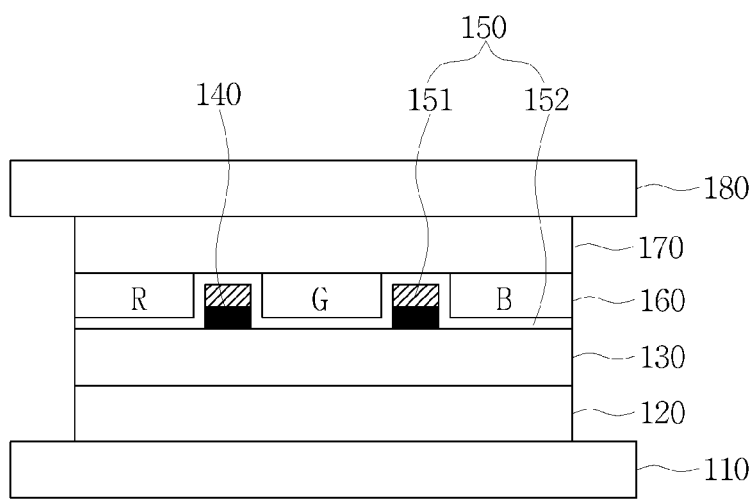

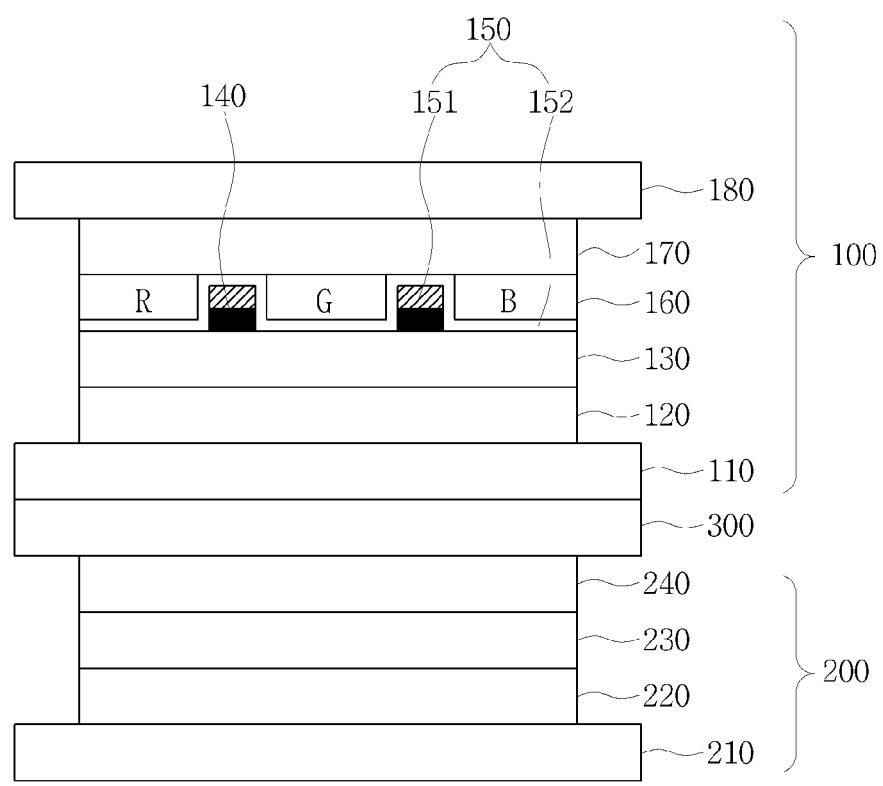
[Figure 5]

TOUCH SENSOR INTEGRATED COLOR FILTER AND MANUFACTURING METHOD FOR THE SAME

CROSS REFERENCE TO RELATED APPLICATIONS

This application is a Divisional of U.S. application Ser. No. 16/096,762 filed Oct. 26, 2018, which is a National Stage of International Application No. PCT/KR2017/004339, filed Apr. 24, 2017, claiming priority based on Korean Patent Application No. 10-2016-0053035, filed Apr. 29, 2016, the contents of all of which are incorporated herein by reference in their entirety.

TECHNICAL FIELD

The present invention relates to a touch sensor integrated color filter and a manufacturing method for the same. Particularly, the present invention relates to a touch sensor integrated color filter and a manufacturing method for the same which carries out procedures on a carrier substrate.

BACKGROUND ART

As a touch input method attracts attention as a next generation input method, there have been attempts to introduce a touch input method to a wider variety of electronic devices. Accordingly, research and development of a touch sensor which can be applied to various environments and can accurately recognize a touch are actively performed.

For example, in the case of an electronic device having a touch-type display, an ultra-thin flexible display, which achieves light weight, low power and improved portability, has been attracting attention as a next generation display, and development of a touch sensor applicable to such a display has been required.

The flexible display is prepared on a flexible substrate that can bend, fold or roll without damage of its properties, and it may be in the form of a flexible LCD, a flexible OLED, electronic paper, etc.

A capacitive touch sensor panel overlaid on an LCD or an OLED may be used to apply a touch input method to the flexible display. Such capacitive touch sensor panel may be formed by a matrix of touch driving lines and touch sensing lines made of a substantially transparent conductive material such as ITO (indium tin oxide). These touch driving lines and touch sensing lines are arranged in rows and columns on a substantially transparent substrate. When an object such as a user's finger is near the intersection of the touch driving line and the touch sensing line, the capacitance between the touch driving line and the touch sensing line may change. This change in capacitance can indicate that a touch is occurring at this location.

However, when a capacitive touch sensor panel is overlaid on an LCD or an OLED, there are problems such as increase in thickness and weight of display, decrease in brightness, and increase in manufacturing cost.

Accordingly, an attempt has been made to integrate a touch sensor inside a display device.

The method disclosed in Korean Patent Publication No. 10-2014-0041949 uses an in-cell and/or on-cell touch sensor component including an in-cell and/or an on-cell black matrix material which also acts as a touch driving or sensing electrode.

However, in this method, a color filter layer is formed on a lower substrate on which a thin film transistor array is formed, and a black matrix material is formed on an upper substrate spaced apart with a liquid crystal layer interposed therebetween. Thus, the black matrix occupies a large area in order to distinguish and block the light between color filter pixels, which decreases the light efficiency of the display device.

On the other hand, Korean Patent Publication No. 10-2014-0070340 proposes a method of forming a touch sensor on a protective film on an OLED.

However, in such a method, a touch sensor must be formed using a transparent conductive material in order to ensure the visibility of the display device. In the case of transparent conductive material, the resistance value of the transparent conductive material is higher than that of a metal material, thereby deteriorating the performance of the touch sensor.

DISCLOSURE OF INVENTION

Technical Problem

An object of the present invention is to provide a flexible color filter having touch sensor integrated therein which has enhanced light efficiency and visibility.

Another object of the present invention is to provide a flexible display having superior visibility and touch performance by integrating a touch sensor into a color filter.

Yet another object of the present invention is to provide a manufacturing method for a touch sensor integrated color filter with low cost and simple process.

Technical Solution

According to an aspect of the present invention, there is provided a flexible color filter having touch sensor integrated therein, comprising: a base film; a separation layer on the base film; a protective layer on the separation layer; a black matrix (BM) layer formed on the protective layer to define a pixel region; a touch sensor layer formed on the BM layer; a colorant layer formed on the touch sensor layer in the pixel region; and an insulation layer on the touch sensor layer and the colorant layer.

The touch sensor layer may include a first layer of a metal material, and the touch sensor layer may also include a second layer of a transparent conductive material.

The first layer may be at least partially overlapped with the BM layer. The width of the first layer may not be greater than the width of the BM layer.

The first layer may be a metal mesh.

The touch sensor layer may include a bridge electrode, and particularly the first layer may be a bridge electrode layer.

The base film may be any one of a polarizing plate, an isotropic film, a retardation film and a protective film.

According to another aspect of the present invention, there is provided a method of manufacturing a touch sensor integrated flexible color filter, comprising the steps of: forming a separation layer by applying a composition for forming the separation layer on a carrier substrate; forming a protective layer by applying a composition for forming the protective layer on the separation layer; forming a black matrix (BM) layer on the protective layer; forming a touch sensor layer on the BM layer; forming a colorant layer on the touch sensor layer; forming an insulation layer on the touch sensor layer and the colorant layer; removing the carrier substrate; and attaching a flexible base film on a side of the separation layer from which the carrier substrate is removed.

The step of forming a touch sensor layer may include the step of forming a first layer of a metal material, and it may also include the step of forming a second layer of a transparent conductive material.

In the step of forming a BM layer, an alignment key may be formed, and the first layer may be formed using the alignment key in the step of forming a touch sensor layer.

According to yet another aspect of the present invention, there is provided a flexible display device comprising a flexible color filter having touch sensor integrated therein which is described above. The flexible display device may be a liquid crystal display device or an organic light emitting diode display device.

Advantageous Effects

According to a touch sensor integrated color filter of the present invention, the light efficiency and visibility of a flexible display are enhanced since a touch sensor layer consists of a metal layer and a transparent conductive layer and the metal layer is formed on a BM layer of a flexible color filter to be blocked by the BM layer.

As the metal layer of the touch sensor layer is blocked by the BM layer, the touch sensor layer may be formed in a two-layer structure including the metal layer having a low resistance, thereby improving the touch performance.

When the metal layer is formed on the BM layer, an alignment key formed in the step of forming the BM layer can be used to reduce the number of process steps so that the touch sensor integrated color filter can be manufactured with low cost and simple process.

DESCRIPTION OF DRAWINGS

FIG. 1 is a cross-sectional view of the touch sensor integrated color filter according to one embodiment of the present invention.

FIG. 2 is a cross-sectional view of the touch sensor integrated color filter according to another embodiment of the present invention.

FIG. 3 is a cross-sectional view of the touch sensor integrated color filter according to yet another embodiment of the present invention.

FIGS. 4a to 4j are cross-sectional views schematically showing procedures according to one embodiment of the touch sensor integrated color filter manufacturing method of the present invention.

FIG. 5 is a cross-sectional view of the flexible display device including the touch sensor integrated color filter according to one embodiment of the present invention.

BEST MODE

The present invention is to provide a color filter having touch sensor integrated therein with improved visibility and touch sensing capability and a method of manufacturing the same through a simple process.

Hereinafter, preferred embodiments of a color filter having touch sensor integrated therein and a manufacturing method for the same will be described in detail with reference to the accompanying drawings. However, the drawings accompanying the present disclosure are mere examples for describing the present invention, and the present invention is not limited by the drawings. Also, some elements may be exaggerated, scaled-down, or omitted in the drawing for clearer expressions.

FIG. 1 is a cross-sectional view showing a color filter having touch sensor integrated therein according to one embodiment of the present invention.

Referring to FIG. 1, the color filter 100 having touch sensor integrated therein comprises a base film 110, a separation layer 120, a protective layer 130, a black matrix (BM) layer 140, a touch sensor layer 150, a colorant layer 160, an insulation layer 170, and a protective film 180.

According to the present invention, at least one of the layers constituting the color filter 100, preferably the separation layer 120 or the protective layer 130, more preferably the separation layer 120 may be an organic layer to provide a flexible color filter.

The organic layer may be made of a polymer. The polymer may comprise at least one selected from the group consisting of polyacrylate, polymethacrylate (e.g., PMMA), polyimide, polyamide, poly vinyl alcohol, polyamic acid, polyolefin (e.g., PE, PP), polystyrene, polynorbornene, phenylmaleimide copolymer, polyazobenzene, polyphenylenephthalamide, polyester (e.g., PET, PBT), polyarylate, cinnamate polymer, coumarin polymer, phthalimidine polymer, chalcone polymer and aromatic acetylene polymer.

The above polymer may be applicable to at least one layer selected from the group consisting of the base film 110, the separation layer 120, the protective layer 130, the BM layer 140, the colorant layer 160, the insulation layer 170, and combinations thereof. For example, the same or similar polymer may be applied to each layer, or polyacrylate is applied only to the separation layer 120, and the remaining layers may be made of materials known in the art.

The base film 110 may be a transparent film or a polarizing plate.

The transparent film is not limited if it has good transparency, mechanical strength and thermal stability. Specific examples of the transparent film may include thermoplastic resins, e.g., polyester resins such as polyethylene terephthalate, polyethylene isophthalate, polyethylene naphthalate and polybutylene terephthalate; cellulose resins such as diacetylcellulose and triacetylcellulose; polycarbonate resins; acrylate resins such as polymethyl (meth)acrylate and polyethyl (meth)acrylate; styrene resins such as polystyrene and acrylonitrile-styrene copolymer; polyolefin resins such as polyethylene, polypropylene, polyolefin having a cyclic or norbornene structure, and ethylene-propylene copolymer; vinyl chloride resins; amide resins such as nylon and aromatic polyamide; imide resins; polyethersulfone resins; sulfone resins; polyether ether ketone resins; polyphenylene sulfide resins; vinyl alcohol resins; vinylidene chloride resins; vinyl butyral resins; allylate resins; polyoxymethylene resins; and epoxy resins. Also, a film consisting of a blend of the thermoplastic resins may be used. In addition, thermally curable or UV curable resins such as (meth)acrylate, urethane, acrylic urethane, epoxy and silicon resins may be used.

Such a transparent film may have a suitable thickness. For example, considering workability in terms of strength and handling, or thin layer property, the thickness of the transparent film may range from 1 to 500 μm, preferably 1 to 300 μm, more preferably 5 to 200 μm.

The transparent film may contain at least one suitable additive. Examples of the additive may include an UV absorber, an antioxidant, a lubricant, a plasticizer, a releasing agent, a coloring-preventing agent, an anti-flame agent, a nucleation agent, an anti-static agent, a pigment and a colorant. The transparent film may comprise various functional layers including a hard coating layer, an anti-reflective layer and a gas barrier layer, but the present invention is not limited thereto. That is, other functional layers may also be included depending on the desired use.

If necessary, the transparent film may be surface-treated. For example, the surface treatment may be carried out by drying method such as plasma, corona and primer treatment, or by chemical method such as alkali treatment including saponification.

Also, the transparent film may be an isotropic film, a retardation film or a protective film.

In the case of the isotropic film, it is preferred to satisfy an in-plane retardation (Ro) of 40 nm or less, preferably 15 nm or less and a thickness retardation (Rth) of −90 nm to +75 nm, preferably −80 nm to +60 nm, particularly −70 nm to +45 nm, the in-plane retardation (Ro) and thickness retardation (Rth) being represented by the following equations.

$$Ro=[(nx-ny)*d]$$

$$Rth=[(nx+ny)/2-nz]*d$$

wherein, nx and ny are each a main refractive index in a film plane, nz is a refractive index in the thickness direction of film, and d is a thickness of film.

The retardation film may be prepared by uniaxial stretching or biaxial stretching of a polymer film, coating of a polymer or coating of a liquid crystal, and it is generally used for improvement or control of optical properties, e.g., viewing angle compensation, color sensitivity improvement, light leakage prevention, or color control of a display.

The retardation film may include a half-wave (½) or quarter-wave (¼) plate, a positive C-plate, a negative C-plate, a positive A-plate, a negative A-plate, and a biaxial plate.

The protective film may be a polymer resin film comprising a pressure-sensitive adhesive (PSA) layer on at least one surface thereof, or a self-adhesive film such as polypropylene. The protective film may be used for protection of the surface of the touch sensor and improvement of processibility.

The polarizing plate may be any one known to be used in a display panel.

Specifically, polyvinyl alcohol (PVA), cellulose triacetate (TAC) or cyclo-olefin polymer (COP) film may be used, but is not limited thereto.

The separation layer 120 is a layer formed for peeling off from a carrier substrate after the color filter is completed in the manufacturing method of the present invention. Accordingly, the separation layer 120 can be separated from the carrier substrate by a physical force and it is laminated on the base film 110 after separation.

It is preferred that the separation layer 120 is formed from a material that can maintain a physical force applied during separation of the separation layer 120 from the carrier substrate within 1N/25 mm.

The protective layer 130 is formed on the separation layer 120 to protect the separation layer 120. The protective layer 130 may be formed of an organic layer described above or an inorganic insulation film.

The BM layer 140 is a shading layer for shielding light in the area except pixel regions and preventing color mixtures on the boundaries of each colorant layer. Accordingly, the BM layer 140 is formed of an opaque material and patterned to surround pixel regions.

The touch sensor layer 150 is located on the pattern of the BM layer 140 and consists of a first layer 151 of an opaque metal material and a second layer 152 of a transparent conductive material.

As the metal material, gold (Au), silver (Ag), copper (Cu), molybdenum (Mo), silver-palladium-copper alloy (APC) or the like may be used, without limitation.

The transparent conductive material may be selected from the metal oxide group consisting of indium tin oxide (ITO), indium zinc oxide (IZO), indium zinc tin oxide (IZTO), aluminum zinc oxide (AZO), gallium zinc oxide (GZO), and fluorine tin oxide (FTO).

The touch sensor layer 150 has a structure of an electrode pattern used for capacitive touch sensor, either mutual-capacitance type or self-capacitance type.

In the case of a mutual-capacitance type, it may be a lattice electrode structure having a horizontal axis and a vertical axis. At the intersection of the electrodes on the horizontal axis and the vertical axis, a bridge electrode may be included.

In the case of a self-capacitance type, it may have an electrode pattern structure in which a change in capacitance is read using one electrode at each point.

The first layer 151 of the touch sensor layer 150, which is made of an opaque metal material, overlaps at least partly with the BM layer 140. That is, when viewed from the BM layer 140 side, the wiring of the first layer 151 is not visible.

When the touch sensor layer 150 includes a bridge electrode (not shown), the bridge electrode may be formed as the first layer 151 made of a metal and overlapped with the BM layer 140.

The second layer 152 is a layer constituting most of the area of the electrode pattern of the touch sensor layer 150, and the touch sensor layer 150 is formed of a single layer of the second layer in the region where the BM layer 140 pattern is not formed. Accordingly, light is not blocked beyond the range of the pattern of the BM layer 140.

As described above, the touch performance can be improved by using a metal layer having a low resistance in the touch sensor layer 150. Moreover, as the opaque metal layer 151 of the touch sensor layer 150 is formed to overlap the BM layer 140, deterioration of the light efficiency or visibility due to the metal layer 151 does not occur.

In addition, the touch sensor layer 150 may include a metal mesh or may have a three-layer structure of transparent conductive layer/metal layer/transparent conductive layer.

The colorant layer 160 is for implementing full color display, and usually red, green, and blue colors are patterned and arranged inside the BM layer 140, which is patterned to enclose each pixel region.

However, the colorant layer does not necessarily include all of red, green, and blue patterns nor only include red, green, and blue patterns. Rather, patterns of some of these colors only can be included according to the color model, or additional color patterns such as white can be included.

In the touch sensor integrated color filter according to one embodiment of the present invention, as shown in FIG. 1, the colorant layer 160 is formed on the touch sensor layer 150 in the vertical structure and the colorant layer 160 is arranged in the pixel regions surrounded by the BM layer 140 and the first layer 151 formed on the BM layer 140 and patterned to overlap with the BM layer 140.

An insulation layer 170 is formed on the touch sensor layer 150 and the colorant layer 160. The insulation layer 170 serves to protect the surface of the touch sensor layer 150 from corrosion and to protect the colorant layer 160. It is preferable that the insulation layer 170 is formed to fill the space between the touch sensor layer 150 and the colorant layer 160 with a constant height. That is, it is preferable that the surface of the insulation layer 170, which is opposite to the surface in contact with the touch sensor layer 150 and the colorant layer 160, is formed flat so as to prevent the unevenness of the lower layer from being revealed.

On the insulation layer 170, a protective film 180 is attached. As the protective film 180, films similar to those described above with reference to the base film 110 can be used.

On the other hand, the arrangement of the metal layer and the transparent conductive layer constituting the touch sensor layer may be reversed. That is, instead of forming the transparent conductive layer on the metal layer, the metal layer can be formed on the transparent conductive layer on the contrary.

FIG. 2 is a cross-sectional view of the touch sensor integrated color filter according to another embodiment of the present invention.

The embodiment shown in FIG. 2 is similar to the embodiment shown in FIG. 1 except that a transparent conductive layer 156 is formed on the BM layer 140 and a metal layer 157 is formed on the transparent conductive layer 156. The pattern of the metal layer 157 is formed so as to overlap at least partly with the pattern of the BM layer 140.

The transparent conductive layer 156 and the metal layer 157 constitute the touch sensor layer 155.

The colorant layer 160 is disposed in the pixel region surrounded by the pattern of the BM layer 140 and is formed in between the metal layers 157 on the transparent conductive layer 156.

In the embodiment shown in FIG. 2, the metal layer 157 having a low resistance and a pattern overlapping with the BM layer 140 is also used for the touch sensor layer 155 to improve the touch performance and not to deteriorate visibility as in the embodiment shown in FIG. 1.

FIG. 3 is a cross-sectional view of the touch sensor integrated color filter according to yet another embodiment of the present invention.

The embodiment shown in FIG. 3 is similar to the embodiment shown in FIG. 1 except that a touch sensor layer 159 made of metal only is formed on the BM layer 140.

The colorant layer 160 is disposed in a pixel region surrounded by the pattern of the BM layer 140 as in the other embodiments.

The embodiment shown in FIG. 3 also has an advantage of improved touch performance and unimpaired visibility thanks to the touch sensor layer 159 having a low resistance and a pattern overlapping with the BM layer 140. In particular, the touch sensor layer 159 may be formed of a metal mesh.

FIGS. 4a to 4j are cross-sectional views schematically showing procedures according to one embodiment of the touch sensor integrated color filter manufacturing method of the present invention.

In the color filter manufacturing method according to one embodiment of the present invention, since the procedures are carried out on a carrier substrate, high resolution pattern can be obtained and the material of the plastic substrate is not limited. As the touch sensor layer is formed on the BM layer and the BM layer blocks the wiring of the touch sensor layer, the visibility is increased. In addition, the metal layer can be used for the wiring of the touch sensor layer together with the transparent conductive layer, which improves performance of the touch sensor.

First, as shown in FIG. 4a, a carrier substrate 190 is prepared, a composition for forming a separation layer is applied, and the separation layer 120 is formed.

The carrier substrate 190 is preferably a glass, but is not limited thereto. That is, other kinds of substrate may be used if they are heat-resistant materials that can endure a process temperature for electrode formation and maintain planarization without deformation at a high temperature.

The formation of the separation layer may be carried out by a conventional coating method known in the art. For example, spin coating, die coating, spray coating, roll coating, screen coating, slit coating, dip coating, gravure coating and the like may be mentioned. Or, an inkjet method may be used.

After coating, the separation layer 120 is subject to curing by way of thermal curing or UV curing. These thermal curing and UV curing may be carried out alone or in combination thereof. In case of thermal curing, an oven or hot plate may be used. Heating temperature and time depend on compositions, and, for example, curing may be performed at 80 to 250° C. for 10 to 120 minutes.

Next, as shown in FIG. 4b, a composition for forming a protective layer is applied on the separation layer 120, and the protective layer 130 is formed.

Meanwhile, since the separation layer 120 can be peeled off by a physical force and the peeling strength is very weak as described above, the protective layer may be formed to cover both sides of the separation layer.

The coating method and the curing step of the composition for forming the protective layer are as described above.

Then, as shown in FIG. 4c, a BM layer 140 is formed on the protective layer 130. The BM layer 140 is formed by patterning an opaque organic material, and an alignment key (not shown) is formed together, which will be used when the metal layer (151 in FIG. 4d) which is a part of the touch sensor layer is formed.

Now, as shown in FIG. 4d, a metal layer 151, which is a part of the touch sensor layer, is formed on the BM layer 140.

The metal layer 151 is formed so as to at least partially overlap with the BM layer 140 by using the alignment key formed together in the BM layer 140 formation step. The width of the metal layer 151 is not wider than that of the BM layer 140 so that the wiring of the metal layer 151 is not to be seen as blocked when viewed from the side of the BM layer 140.

At this time, the metal layer 151 may be formed to include a metal mesh or a bridge electrode.

Next, as shown in FIG. 4e, a transparent conductive layer 152 constituting a touch sensor layer is formed on the metal layer 151.

The metal layer 151 and the transparent conductive layer 152 together form the touch sensor layer 150 forming a touch sensor pattern.

If necessary, a step of forming an insulation film between the metal layer 151 and the transparent conductive layer 152 may be added.

Now, as shown in FIG. 4f, a colorant layer 160 of red (R), green (G), and blue (B) colors is formed in the pixel regions defined by the pattern of the BM layer 140. Colors of the colorant layer 160 may be selected discretionally, and the formation order of the colors may be selected discretionally as well.

The coating method and the curing process of the colorant layer 160 are as described above.

Next, as shown in FIG. 4g, an insulation layer 170 is formed to cover the entirety of the touch sensor layer 150 and the colorant layer 160.

The insulation layer 170 may be formed of at least one material selected from a curable prepolymer, a curable polymer, and a plastic polymer.

The insulation layer 170 is formed so that the upper surface of the insulation layer 170 has a flat shape with a constant height. That is, an insulating material having appropriate viscoelasticity should be used so that the irregularities of the touch sensor layer 150 and the colorant layer 160 located below the insulation layer 170 should not be transferred.

Specifically, a liquid material to be an insulation layer is applied on the touch sensor layer 150 and the colorant layer 160, and an insulation layer is formed through a film forming step.

Now, as shown in FIG. 4h, a protective film 180 is attached on the insulation layer 170.

The protective film 180 may be a film made of a polymer resin including an adhesive layer on at least one side of the film or a self-adhesive film such as polypropylene. It is used to protect the surface of the touch sensor integrated color filter and improve the processability thereafter.

Subsequently, as shown in FIG. 4i, the carrier substrate 190, which was used to carry out the preparation of the color filter having touch sensor integrated therein, is separated.

The separation of the carrier substrate 190 from the separation layer 120 is performed at room temperature and carried out by a physical peeling in which the carrier substrate 190 made of, for example, glass, is peeled off from the separation layer 120.

Examples of the peeling method may include lift-off and peel-off, without limitation.

Thereafter, as shown in FIG. 4j, a base film 110 is attached on the separation layer 120.

The base film 110 is flexible and can be selected from the above-mentioned materials, and can be a transparent film or a polarizing plate.

Though it is not shown in the drawings, the base film 110 can be adhered to the separation layer 120 using an adhesive layer, and a photo-curable adhesive may be used. As the photo-curable adhesive does not need a separate drying process after photo curing, the fabrication process is simple. As a result, the productivity increases. In the present invention, photo-curable adhesives available in the field of the art may be used without particular limitation. For example, a composition comprising an epoxy compound or acrylic monomer may be used.

For curing of the adhesive layer, light such as far ultraviolet ray, ultraviolet ray, near ultraviolet ray, infrared ray, electromagnetic wave such as X ray, v ray may be used, and electron beam, proton beam, neutron beam as well. However, UV curing is advantageous in terms of curing speed, availability of curing device, cost, and so on.

A high pressure mercury lamp, electrodeless lamp, extra high pressure mercury lamp, carbon arc lamp, xenon lamp, metal halide lamp, chemical lamp, black light and the like can be used as a light source of UV curing.

FIG. 5 is a cross-sectional view of the flexible display device including the touch sensor integrated color filter according to one embodiment of the present invention.

Referring to FIG. 5, a flexible display device including a touch sensor integrated color filter according to an embodiment of the present invention includes a color filter 100 as shown in FIG. 1 and a substrate 200 having a thin film transistor (TFT) array. The substrate 200 shown in FIG. 5 is a TFT+OLED substrate 200 having a TFT layer 220 and an organic light emitting diode (OLED) layer 230.

The TFT layer 220 and the OLED layer 230 of the TFT+OLED substrate 200 are disposed on the flexible base film 210 and the OLED layer 230 is sealed by an encapsulation layer 240. The TFT+OLED substrate 200 can also be manufactured by any method known in the field of flexible display technology, and the specific structure thereof is not particularly limited in the present invention.

An adhesive layer 300 for bonding two substrates is formed between the touch sensor integrated color filter 100 and the TFT+OLED substrate 200. The adhesive layer 300 is composed of an optically clear adhesive (OCA) or an optically clear resin (OCR).

Meanwhile, although a method of fabricating a flexible OLED display device by combining a TFT+OLED substrate and a touch sensor integrated color filter has been described, the present invention is not limited thereto. For example, when a flexible liquid crystal display device is to be manufactured by inserting a liquid crystal layer between a TFT array substrate and a color filter instead of the OLED, the flexible display device of the present invention may be prepared with obvious modifications for those skilled in the art without departing from the scope of the invention.

Although particular embodiments and examples of the present invention have been shown and described, it will be understood by those skilled in the art that it is not intended to limit the present invention to the preferred embodiments, and it will be obvious to those skilled in the art that various changes and modifications may be made without departing from the spirit and scope of the invention.

The scope of the present invention, therefore, is to be defined by the appended claims and equivalents thereof.

DESCRIPTION OF REFERENCE NUMERALS

100: touch sensor integrated color filter
110: base film
120: separation layer
130: protective layer
140: black matrix layer
150, 155, 159: touch sensor layer
151, 157: metal layer
152, 156: transparent conductive layer
160: colorant layer
170: insulation layer
180: protective film
190: carrier substrate
200: TFT+OLED substrate
210: base film
220: TFT layer
230: OLED layer
240: encapsulation layer
300: adhesive layer

The invention claimed is:

1. A flexible color filter having touch sensor integrated therein, comprising:
  a base film;
  a separation layer on top of the base film;
  a protective layer on top of the separation layer;
  a black matrix (BM) layer formed on top of the protective layer to define a pixel region;
  a touch sensor layer having a first layer and a second layer, wherein the first layer is formed of metal material and the second layer is formed of transparent conductive material, wherein the first layer is formed on top of the black matrix and top and both side surfaces of the first layer are surrounded by the second layer while being in direct contact with the second layer, and wherein the first layer is at least partially overlapped with the black matrix;

a colorant layer formed on top of the second layer in the pixel region, wherein the colorant layer is not overlapped with the first layer; and an insulation layer on top of the touch sensor layer and the colorant layer.

2. The flexible color filter of claim 1, wherein a width of the first layer is not greater than a width of the BM layer.

3. The flexible color filter of claim 1, wherein the first layer is a metal mesh.

4. The flexible color filter of claim 1, wherein the touch sensor layer includes a bridge electrode.

5. The flexible color filter of claim 1, wherein the first layer is a bridge electrode layer.

6. The flexible color filter of claim 1, wherein the base film is any one of a polarizing plate, an isotropic film, a retardation film, and a protective film.

7. A flexible display device comprising the flexible color filter of claim 1.

8. The flexible display device of claim 7, wherein the flexible display device is a liquid crystal display device or an organic light emitting diode display device.

* * * * *